United States Patent [19]

Eddy et al.

[11] Patent Number: 5,189,420
[45] Date of Patent: Feb. 23, 1993

[54] METHOD AND APPARATUS FOR DIRECT ANALOG TO FORMATTED DIGITAL NUMBER CONVERSION

[75] Inventors: F. Neal Eddy, Weston; Joel M. Schoen, Sudbury, both of Mass.

[73] Assignee: The Mitre Corporation, Bedford, Mass.

[21] Appl. No.: 534,941

[22] Filed: Jun. 8, 1990

[51] Int. Cl.⁵ ............................................. H03M 1/60
[52] U.S. Cl. .................................. 341/157; 324/76.52
[58] Field of Search ............... 341/157, 155, 133, 171, 341/127; 324/82, 83 D, 98 D, 99 D, 318, 322

[56] References Cited

U.S. PATENT DOCUMENTS

| | | | |
|---|---|---|---|
| 3,092,736 | 6/1963 | Ernyei | 341/157 X |
| 3,189,820 | 6/1965 | Lowman | 324/82 |
| 3,354,453 | 11/1967 | Hibbits et al. | 341/157 |
| 3,440,645 | 4/1969 | Feigleson | 341/157 |
| 3,533,101 | 10/1970 | Lauchner et al. | |
| 3,622,881 | 3/1969 | Silver et al. | 324/120 |
| 3,745,559 | 7/1973 | Mattern | 341/162 X |
| 3,936,820 | 6/1974 | Goldstone et al. | 340/347 |
| 4,041,284 | 9/1976 | Bond | 235/150.5 |
| 4,075,577 | 2/1978 | Walker | 341/157 X |
| 4,188,628 | 2/1980 | Langeraar et al. | 324/83 D X |
| 4,344,052 | 8/1982 | Davidson | 333/222 |
| 4,389,612 | 6/1983 | Simmonds et al. | 324/248 |
| 4,468,635 | 8/1984 | Lukens et al. | 331/107 |
| 4,470,023 | 9/1984 | Lukens et al. | 331/107 |
| 4,471,340 | 9/1984 | Lewis | 341/157 |
| 4,868,573 | 9/1989 | Wittmer | 341/157 |

FOREIGN PATENT DOCUMENTS 875618 10/1981 U.S.S.R. .

OTHER PUBLICATIONS

Szabo et al., "Residue Arithmetic and its Applications to Computer Technology," 1967 pp. 170-176.
Ramamoorthy et al., "High-Speed ADC Using Residue Number System", IEEE Conference Proceedings, 1989.
Withers et al., "Superconductive Analog Signal Processing Devices," Proceedings Of The IEEE, 77:1247-1263 1989.
Lee et al., "Superconductive A/D Converters," Proceedings Of The IEEE, 77: 1265-1273 1989.
Oberg, "Use of Residue Arithmetic for Resolving Ambiguity in Phase Measurements," IEEE Transactions on Instrumentation and Measurement, 38: 1007-1009 1989.

Primary Examiner—Sharon D. Logan
Attorney, Agent, or Firm—Fish & Richardson

[57] ABSTRACT

Method and apparatus for directly converting the value of an analog signal into a digital format for a prespecified number system. For analog to digital residue number conversion, a plurality of residue channels convert the analog value to a set of digitized residues corresponding to a prespecified set of residue bases.

25 Claims, 4 Drawing Sheets

RESIDUE BASES B : 2, 5, 7   DECIMAL NUMBERS : 25, 54, 62

FIG. 1a

RESIDUE REPRESENTATION

| RESIDUE BASE B = | 2 | 5 | 7 |
|---|---|---|---|
| DECIMAL NUMBER = 25 | $2\overline{)25} = 12 + 1/2$<br>1 | $5\overline{)25} = 5 + 0/5$<br>0 | $7\overline{)25} = 3 + 4/7$<br>4 |
| 54 | 0 | 4 | 5 |
| 62 | 0 | 2 | 6 |

METHOD AND APPARATUS FOR DIRECT ANALOG TO FORMATTED DIGITAL NUMBER CONVERSION

BACKGROUND OF THE INVENTION

This invention relates to converting analog values to digital integers.

Conversion of an analog signal to an equivalent digital representation is conventionally required for subsequent digital processing of that signal. Two important portions of the conversion process consist of quantizing the analog signal into one of a series of discrete values and then uniquely coding that value. For example, digital signal processing (DSP) of a radar signal by a digital computer requires that the analog radar signal first be converted to a corresponding digital code, or format, that is compatible with and understood by the digital computer. The choice of a particular digital format, e.g., binary format, is dictated by the DSP computer's architecture and the processing algorithms implemented on the computer.

One possible digital format for representing an analog signal in a DSP computer is the digital residue number format. Using this format, the value of an analog signal may be represented by one or more digitized integer "residues", or remainders, with each residue corresponding to a particular residue base, or divider. Given this equivalent digital representation by a set of residues, the value of an analog signal is effectively decomposed into component factors which may be digitally processed independently and in parallel.

The digital residue format is particularly well suited for high-speed DSP operations on an analog signal; a conventional DSP computer can complete a set of simultaneous, parallel component operations much faster than it can complete the equivalent single serial operation. In particular, if the DSP parallel component-operations each require a smaller computer word size than the equivalent serial operation, and can proceed independently of the other component-operations, the overall efficiency of a DSP mathematical computation may be significantly increased using component-operations. Furthermore, DSP algorithms which require many repetitive operations, such as fast Fourier transforms, may be implemented with elementary, rather than complex, hardware if the repetitive operations are decomposed into elementary sub-operations. Thus, the digital residue representation of an analog signal provides an ideal format for fast, efficient DSP processing of that signal.

Conventionally, an analog signal is indirectly converted to a digital residue representation by first converting the analog signal to a binary format that represents the decimal value of the signal, and then digitally processing that format to achieve another binary format that represents the desired digital residue value of the signal.

SUMMARY OF THE INVENTION

In general, in one aspect, the invention features a method for converting an analog signal directly into digital format for a preselected number system. Following this method, a periodic signal having a frequency that is a function of the amplitude of the analog signal is first generated. This signal is then delayed, thereby producing a time delayed version of the signal with a phase shift, relative to the undelayed signal, that corresponds to one coded value of the amplitude of the analog signal in the preselected number system. Finally, the time-delayed signal is converted into a digital format for the coded value, thereby converting the analog signal to a digital number in the preselected number system.

To implement this method, the invention features apparatus including an oscillator that generates a periodic signal whose frequency depends on the amplitude of a time-sample of the analog signal. A delay line is connected to produce at least one time-delayed version of the periodic signal, with the phase shifts of the time-delayed signals, relative to the oscillator output, corresponding to the number system's coded values for the amplitude of the analog signal. A phase detector converts the delay line outputs to the digital format for the preselected number system.

For analog to digital residue number conversion, the preselected number system is composed of at least one residue base, preferably a plurality of residue bases. The delay line is tapped, or equivalently implemented, to produce a plurality of time-delayed signals each with a phase shift that corresponds to the residue of the amplitude of the time sample for a respective one of the preselected residue bases.

In another aspect of the invention, a plurality of residue channels are provided, whereby each channel generates a digital residue corresponding to one of the preselected residue bases. Each residue channel includes one or more variable frequency oscillators, corresponding delay lines, and a phase detector for generating a digital format for the residue of the analog signal in the residue base of the channel.

In preferred embodiments of the invention, the apparatus includes at least one residue channel for detecting errors in the digital residues that are generated by the other residue channels. An array of phase-locked Josephson junction oscillators generates a periodic signal whose frequency is linearly proportional to the amplitude of analog signal's time-sample. Each of the residue channels includes superconducting delay lines for producing one or more delayed versions of the Josephson junction output signal. A phase detector and quantization circuitry in each residue channel generate the digital format for the analog signal's residue in the residue base of the channel.

The invention provides the ability to convert an analog signal to a digital residue format, or any other digital number format, without the time-consuming intermediate process of converting the analog signal to a binary format. Furthermore, the dynamic range and conversion speed obtained by the invention are substantially increased over that obtained by existing analog-to-binary-to-residue devices because each residue channel operates almost completely independently of the other channels.

Other advantages and features of the invention will become apparent from the following description of the preferred embodiment and from the claims.

DESCRIPTION OF THE PREFERRED EMBODIMENT

We first briefly describe the drawings.

The analog signal to digital residue converter operates not only to digitize an analog signal, but also to transform the decimal value of that signal to its equivalent representation in a preselected residue format. This decimal to residue transformation, as discussed below, is based on the conventional technique for converting a decimal integer to an equivalent residue number.

Figure 1A:
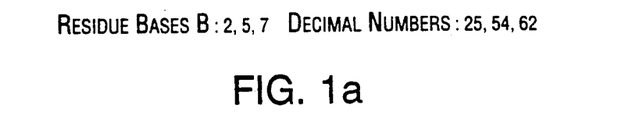
FIGS. 1A–C present a table of the residue conversion and representation of three decimal integers for each of three residue bases.
Figure 1B:
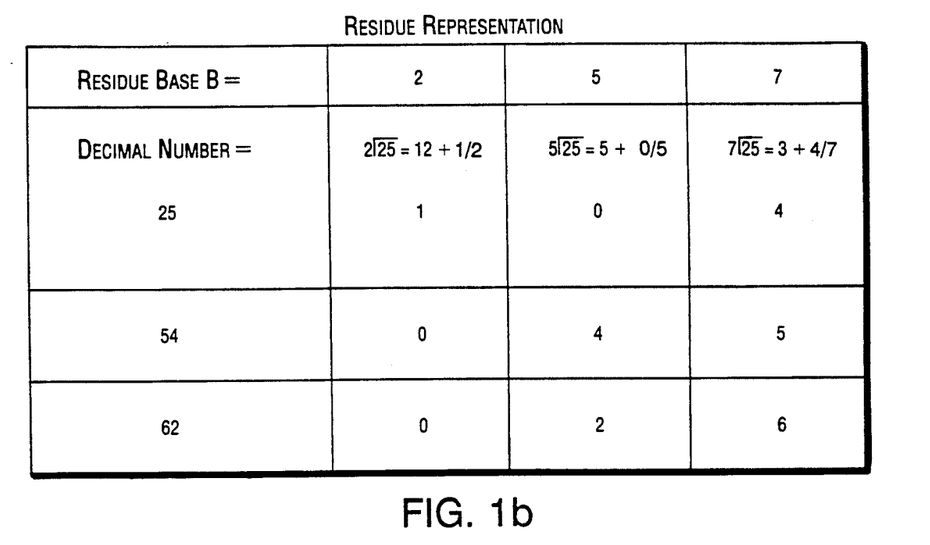

Referring to FIG. 1a, there is shown three residue bases (B), namely 2, 5, and 7, and three decimal integers, namely 25, 54, and 62, for which the residue representation corresponding to each of the three residue bases is determined. As shown in FIG. 1b, the residue representation for a decimal integer is equal to the remainder when that decimal integer is divided by a given residue base. For example, 25 divided by 2 is equal to 12+½, or 12 with a remainder of 1, giving a residue value of 1 for the decimal integer 25 in the base 2 residue system. Similarly, the decimal integers 54 and 62 both have residue values of 0 in the base 2 residue system because 2 divides evenly into 54 and 62.

Figure 1C:
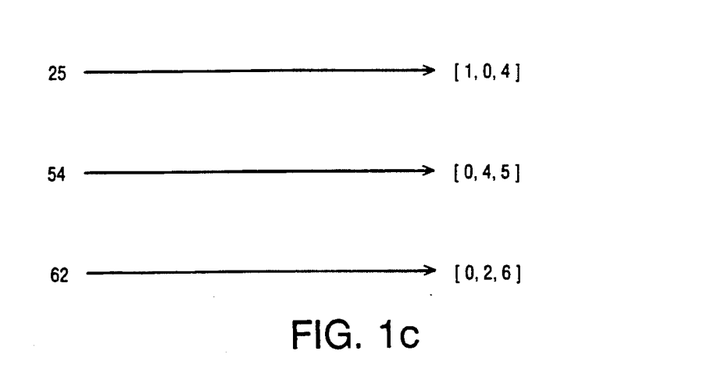

Division of each of the example residue bases (2, 5, 7) into each of the example decimal integers (25, 54, 62) gives a residue representation of [1, 0, 4], [0, 4, 5], and [0, 2, 6] for the integers 25, 54, and 62, respectively, as shown in FIG. 1c. Each residue representation, or set of residues, for a decimal integer includes one residue value corresponding to each of the residue bases chosen for evaluation of the decimal integer, e.g., the three residue bases of the example. In practice, the value and number of residue bases is chosen to achieve a desired dynamic range, or span, of decimal integers that the chosen residue bases can unambiguously represent. Unambiguous representation here means that for a given number of residue bases (3 in the example) each of the decimal integers within the dynamic range will have a unique combination of residues for that integer's set of residue bases.

This dynamic range, according to the Chinese Remainder Theorem, is equal to the product of the chosen residue base values, with the requirement that all of the bases be purely prime or mutually prime, i.e., have no common factors. Given that the residue bases in the example of FIG. 1, i.e., 2, 5, and 7, are both purely and mutually prime, their product, 70 ($2 \times 5 \times 7 = 70$), defines the dynamic range (DR) for the three-residue base system as 0 to 69. Any decimal integer having a value that is equal to or greater than the product of the residue bases (>69 in the example) will have a residue representation which is identical to that of a decimal integer within the calculated span. Accordingly, if a larger span of decimal integers is of interest, more and larger prime or mutually prime residue bases are required to unambiguously represent each integer within the span.

The residue example of FIG. 1 includes only positive decimal integers; a residue format can also represent negative decimal integers in a similiar way that inherently identifies an integer's sign. One possible scheme to achieve this adds an offset value, S, to any negative decimal integer, thereby converting that integer to its negative inverse before evaluating the integer's residue. With this scheme, the value of S is computed as one half of the dynamic range, or possible span, of decimal integers to be converted, as $$S = (B_1 \times B_2 \times \ldots \times B_{max})/2,$$

where $B_{max}$ is the largest residue base of the bases chosen.

Using this scheme, any decimal integer with a value greater than S is presumed to actually be a corresponding negative integer. This negative inverse offset scheme allows all decimal integers within a dynamic range, whether positive or negative, to be represented by a residue format in a consistent manner. Subsequent processing, e.g., arithmetic operations, with residue numbers in this negative-offset format must correspondingly account for the offset shift to achieve valid representations for the processing results.

In the example shown in FIG. 1, the decimal integers 54 and 62 each have a residue of 0 in the base 2 residue system, as discussed above. This parity is not a coincidence; any decimal integer that is a multiple of a given residue base will have a residue of 0 for that base. Likewise, all decimal integers that are equally larger (or smaller) than any multiple of a given residue base will have the same residue for that base.

This parity delineates the set of all possible residues for a residue base. A residue for a given residue base B may have one of the values ranging from 0 to (B-1), with the value 0 corresponding to any decimal multiple of the residue base and the value (B-1) corresponding to any decimal integer having a value equal to one less than any decimal multiple of the residue base. To illustrate the periodic pattern created by this representation, Table 1 below lists the residue representations of the decimal integers between 1 and 30 for the residue bases 2, 3, and 5.

TABLE 1

RESIDUES VALUES OF DECIMAL INTEGERS BETWEEN 1 AND 30 FOR THE RESIDUE BASES 2, 3, AND 5

| DECIMAL INTEGER | RESIDUE BASE 2 3 5 | DECIMAL INTEGER | RESIDUE BASE 2 3 5 | DECIMAL INTEGER | RESIDUE BASE 2 3 5 |
|---|---|---|---|---|---|
| 1 | 1,1,1 | 11 | 1,2,1 | 21 | 1,0,1 |
| 2 | 0,2,2 | 12 | 0,0,2 | 22 | 0,1,2 |
| 3 | 1,0,3 | 13 | 1,1,3 | 23 | 1,2,3 |
| 4 | 0,1,4 | 14 | 0,2,4 | 24 | 0,0,4 |
| 5 | 1,2,0 | 15 | 1,0,0 | 25 | 1,1,0 |
| 6 | 0,0,1 | 16 | 0,1,1 | 26 | 0,2,1 |
| 7 | 1,1,2 | 17 | 1,2,2 | 27 | 1,0,2 |
| 8 | 0,2,3 | 18 | 0,0,3 | 28 | 0,1,3 |
| 9 | 1,0,4 | 19 | 1,1,4 | 29 | 1,2,4 |
| 10 | 0,1,0 | 20 | 0,2,0 | 30 | 0,0,0 |

As shown in Table 1, the possible residues of the residue base 2 may equal 0 or 1, while those of the residue bases 3 and 5 may equal 0, 1, or 2, and 0, 1, 2, 3, or 4, respectively. A periodic pattern in each list of residues is formed by the transition from one of these residues to the next. With this repeating pattern, the set of possible residues for a given residue base is cyclically mapped to the group of decimal integers within the dynamic range of the residue system. The period of each residue cycle is therefore equal to each residue base value B (e.g., 2, 3, or 5 in Table 1). This cyclical relationship has important consequences for the choice of implementation of the conversion hardware for converting the value of a analog Referring to FIG. 2, the hardware system 10 for converting the value of an analog signal 20 to a digital residue format must inherently impress the periodicity of a particular residue base system onto the span of possible values, e.g., voltage amplitudes, of a given analog signal to extract the residue of those voltage amplitudes. As shown schematically in FIG. 2, this is accomplished by sampling the voltage amplitudes of the analog signal 20 with conventional sample and hold circuitry 30, and then processing the voltage amplitude samples for conversion to a digital residue format.

Figure 2:
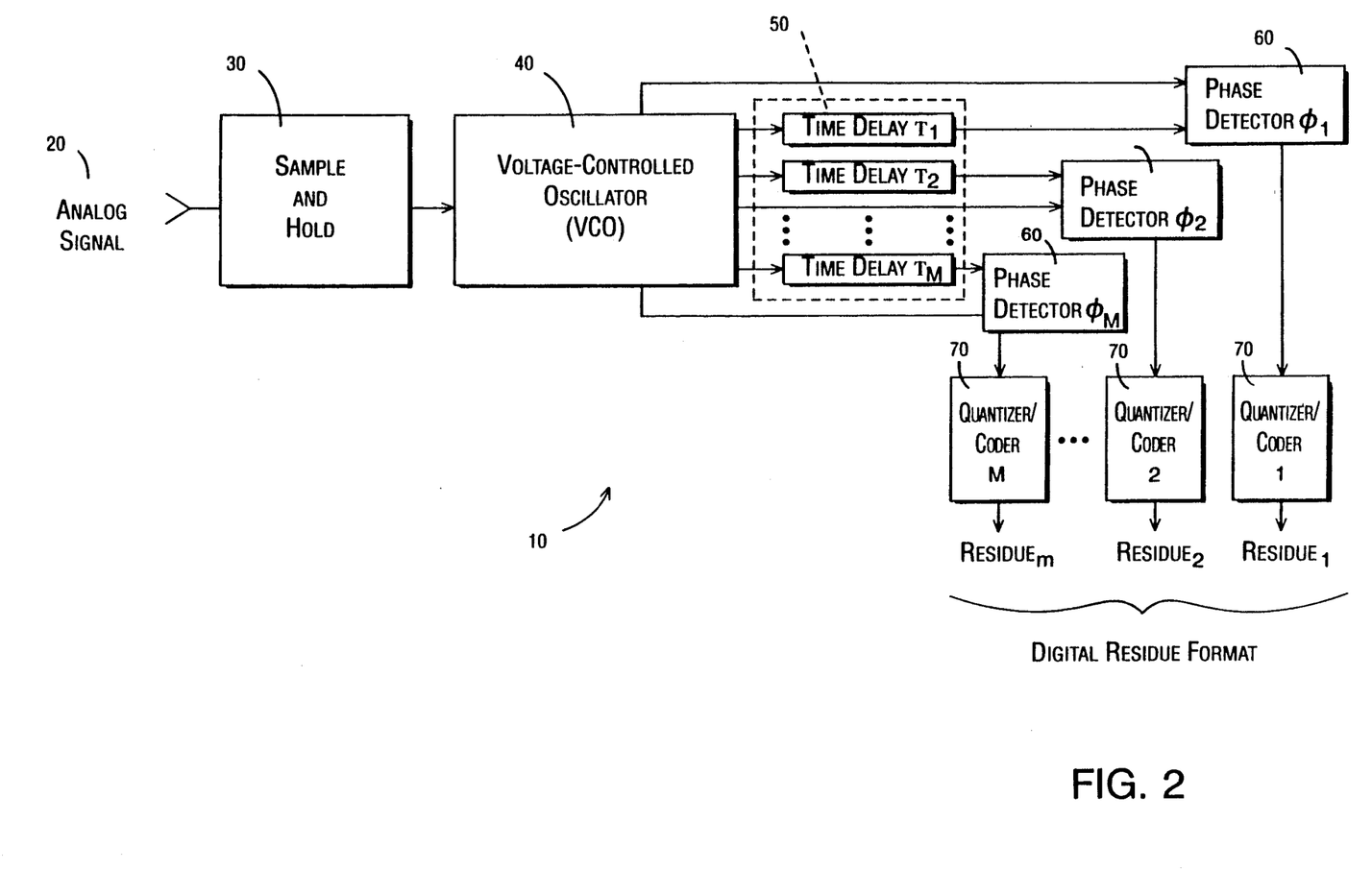
FIG. 2 is a block diagram of an analog signal to digital residue converter according to the invention.

This conversion is achieved by a four-step process which includes voltage to frequency conversion, frequency to phase conversion, phase detection, and quantization/coding. A voltage-controlled oscillator circuit (VCO) 40 accepts a voltage sample of the analog signal 20 from sample and hold circuitry 30 and generates a periodic frequency signal having a frequency that is directly proportional to the amplitude of the voltage sample. This frequency signal is input to time delay circuitry 50 which generates M phase signals, with each of the M phase signals having a phase delay, relative to the undelayed frequency signal, which corresponds to the residue of the analog signal's voltage sample for each of M respective residue bases.

Each of the M phase signals is accepted by corresponding phase detector circuitry 60, which also accepts the VCO's undelayed frequency signal. The phase difference between each of the M delayed phase signals and the undelayed frequency signal is measured by the phase detection circuitry to produce M phase shift signals. The amplitude of each of these M phase shift signals is directly proportional to the residue of the analog signal's voltage sample for the corresponding residue bases. Quantizer/coder circuitry 70, which may be part of the phase detector 60 or distinct, accepts and processes the M phase shift signals to generate a digital binary representation 80 of the M residue values for the analog signal's voltage sample.

The four-step process described above for directly converting the value of an analog signal to an equivalent digital residue representation eliminates the need for time-consuming conversion of a digital decimal representation to a digital residue representation. Furthermore, this conversion process may accommodate a substantially larger signal dynamic range than a conventional all-digital conversion process and can complete the conversion significantly faster than an all-digital process.

Figure 3:
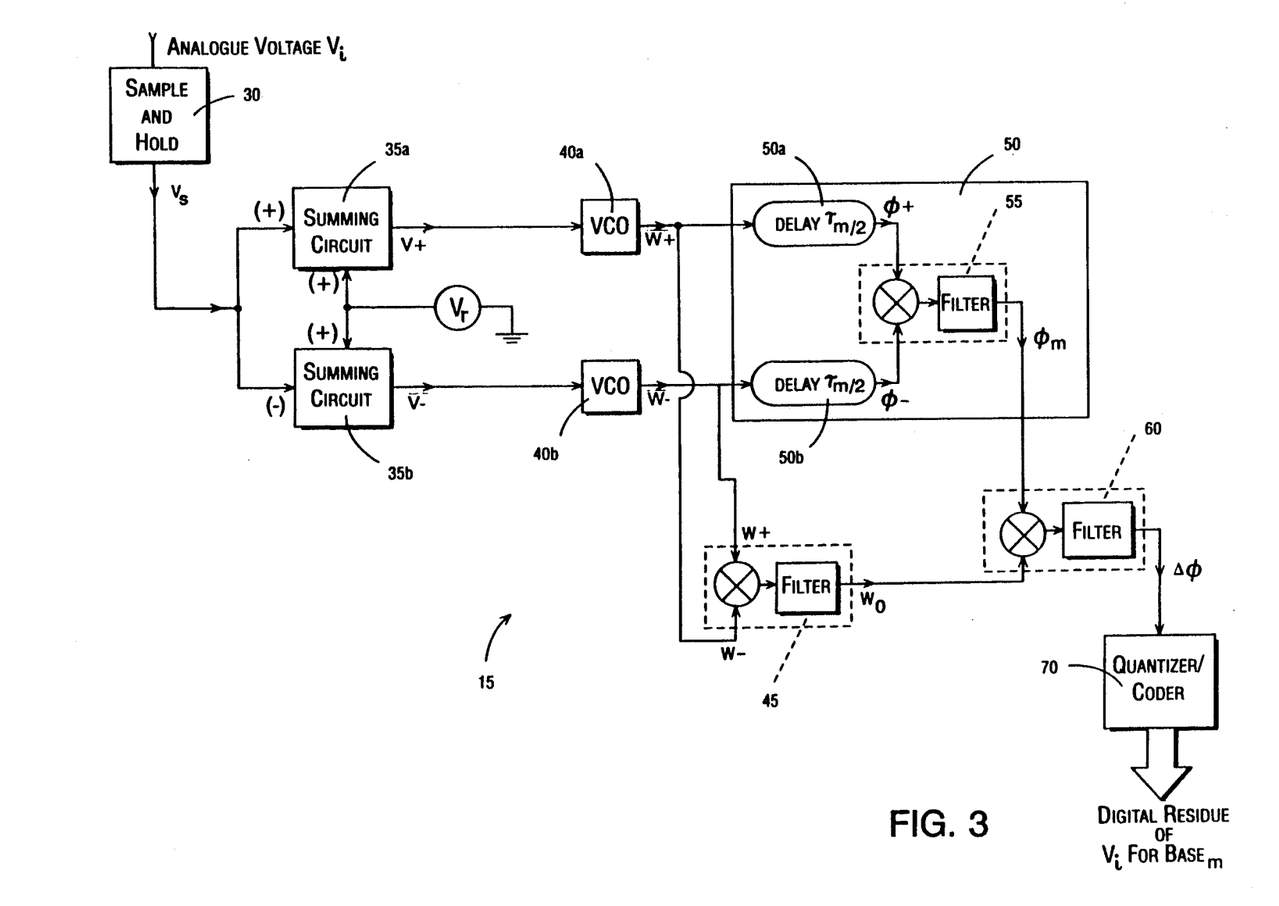
FIG. 3 is a block diagram of one embodiment of the residue converter of FIG. 2 for a single residue number.

Considering the analog to digital residue conversion process in more detail, several hardware implementation schemes each may accomplish the conversion for specific hardware specifications. Referring to FIG. 3, in a first implementation, sample and hold circuitry 30 and accompanying conversion circuitry all together comprise a single channel 15 for converting the value of an analog signal to a digital residue representation for one residue base. This channel 15 is one parallel branch of the complete conversion system (FIG. 1), which in a first implementation includes a similiar channel 15 for each of the residue bases of interest. Each of the channels, like the one of FIG. 3, accepts the analog signal to be converted at the input of its sample and hold circuitry, which quantizes a time-sample of the analog signal's voltage amplitude, $V_i$.

The sample and hold circuitry may include, for example, bandpass and lowpass filtering circuitry for suppressing signal aliasing and transforming the impedance of the analog signal to match the input impedance of the sample and hold circuitry. The filtered analog signal is processed by the sample and hold circuitry to quantize and maintain the analog signal's voltage amplitude value during a quantization period.

The preferable duration of this quantization period, and its corresponding sampling rate, is determined by the requirements of the succeeding conversion circuitry. In particular, the sample and hold circuitry must maintain a given voltage sample value until that value has propagated through the rest of the channel circuitry, including time delay circuitry having a delay time, $\tau$. This condition requires that the sampling quantization period, which is the reciprocal of the sampling rate, $R_s$, be longer than the time delay, $\tau$, of the channel, as $$1/R_x > \tau.$$

The quantization period is further constrained in that the holding circuitry should maintain a given voltage value during the holding period with no greater value decay than an amount which could be quantified by a least significant bit of the digital computer which will process the signal.

As discussed below, the longest realistic time delay of any of the conversion channels time delay circuitry for this conversion implementation may, for example, be equal to about 400 nsec, giving an allowable sample and hold time of 400 nsec. This time duration may be implemented with suitable resistor capacitor networks to achieve an appropriate sampling time window and holding period for a total quantization period of 400 nsec. The sampling rate corresponding to this duration is 2.5 MHz, above which the conversion system may not successfully operate. Other time delay circuit implementations may provide differing sampling rate requirements. The particularly chosen implementation of the delay line elements in the time delay circuitry, along with other circuit parameters, determines the minimum sample and hold quantization period that is required to allow propagation of the voltage sample value through the entire conversion system.

At the end of the quantization period, the quantized voltage sample, $V_s$, is input from the sample and hold circuitry to two identical summing circuits 35a, 35b, with one summing circuit 35a accepting the sample $V_s$ at that circuit's positive input (+) and the other summing circuit 35b accepting the sample $V_s$ at that circuit s negative input (−). Each of the summing circuits also accepts a reference voltage, $V_r$, which it sums with the positive or negative voltage sample. The reference voltage $V_r$ is preferably a precision voltage source whose amplitude is chosen with regard to biasing of the voltage-controlled oscillator, as discussed below. Each summing circuit generates a signal having as its voltage amplitude the sum of the two inputs, with the positive summing circuit 35a generating an additive voltage, $V_+ = V_r + V_i$, and the negative summing circuit 35b generating a subtractive voltage, $V_- = V_r - V_i$.

Both the additive voltage $V_+$ and the subtractive voltage $V_-$ are input to corresponding voltage-controlled oscillators (VCOs) 40a, and 40b, respectively, which each generate a VCO output frequency signal, $\omega_+$ and $\omega_-$, respectively, having a periodic waveform whose angular frequency $\omega$ is a function of that VCO's input voltage. One class of VCOs that is well-suited for this frequency conversion includes oscillators whose output frequency signals are linearly proportional to the oscillators' input voltages.

Within this oscillator class, the choice of linear VCO implementation is dictated by the performance requirements of the overall conversion system. In particular, the desired precision for the digital conversion constrains the allowable VCO linearity and line width. A conversion precision of, for example, 16 bits requires the VCO's linearity and linewidth to be controlled to 1 part in $2^{16}$. This exacting requirement is not achievable with any conventional semiconductor VCO devices, but may be achieved with a superconducting device such as a Josephson junction.

A Josephson junction VCO device is generally composed of two layers of superconducting material that are separated by a thin layer of nonsuperconducting material, e.g., an insulating material. While the superconducting material may comprise either a high- or low-temperature superconductor, the reproducibility of present-day high-temperature superconducting devices lacks that of low-temperature devices, making low-temperature superconducting materials preferable. Additionally, low temperature device operation minimizes the introduction of thermal noise into a device's transfer characteristic. These considerations suggest that an ambient operating temperature on the order of 4° K. is preferable for a Josephson junction VCO. The low temperature superconductors niobium or niobium nitride may, for example, comprise the Josephson junction outside layers, and thin-film magnesium-oxide may form the Josephson junction separation layer.

Alternatively, the Josephson junction may consist of two superconducting layers separated by a nonsuperconducting layer, or may be formed of a continuous layer having a centrally necked down region. Other Josephson junction structures are also possible. Given any combination of material components, the Josephson junction is preferably fully shielded from stray magnetic and electric fields to eliminate the introduction of spurious noise to the Josephson junction input.

With this construction, when a voltage is applied between the Josephson junction's two outside layers, which form a junction with the central separation layer, the outside layers develop a weak coupling across the junction. This coupling causes the differential phase across the junction to "slip" in time at a rate proportional to the magnitude of the applied voltage. The resulting signal that the junction generates consists of a periodic waveform having an angular frequency that is directly proportional to the magnitude of the applied voltage. This proportionality is given as $$\omega = (2\pi) \times (2e/h) \times V_{app},$$

and after substitution of the values for e and h, as $$\omega = (2\pi) \times (4.8359342 \times 10^{14} \text{ radian/Volt. Sec}) \times V_{app},$$

or $$\omega = 2\pi k \text{ radian/v} \times V_{app},$$

where $\omega$ is the output signal's angular frequency, e is the electron charge, h is Planck's constant, and $V_{app}$ is the applied voltage. The variable k is used to represent the numerical value of the constant factor 2e/h, as given above.

The two VCOs in the residue conversion channel of FIG. 3 each accordingly generates an output frequency signal consisting of a periodic waveform with an angular frequency that is proportional to the input voltage as $$\omega_+ = 2\pi k \times (V_r + V_s)$$

and $$\omega_- = 2\pi k \times (V_r - V_s),$$

where $\omega_+$ is the angular frequency of the waveform generated by the positive VCO 40a and $\omega_-$ is the angular frequency of the waveform generated by the negative VCO 40b.

The magnitude of the reference voltage $V_r$ is selected to bias the VCOs+ center frequencies and ranges of operational frequencies. This bias is required because of two inherent limitations of the Josephson junction's transfer characteristic. Firstly, the Josephson junction's frequency conversion function is well controlled for only those input voltages which generate an output signal less than the so-called Riedel current peak. Above this peak, the frequency conversion is uncontrollably rapid. Secondly, as the voltage input to a Josephson junction VCO decreases, the stability of the VCO's output oscillation decreases, with the output waveform becoming increasingly distorted. Thus, the Josephson junction bias and operational range must be set between the regions of the high-frequency Riedel peak and low-frequency distortion.

The bias point of the Josephson junction must also be compatible with the manufacturing and packaging configuration of the device. For example, if the device is interfaced as a discrete component with the other converter circuitry, the VCO operational frequency should be kept below 18 GHz to facilitate the constraints set by the external interconnections of the discrete device package. Conversely, a monolithic implementation which does not require the extraction of the VCO output frequency would not be subject to this frequency range limitation. Given a discrete component implementation, a reasonable range of Josephson junction operation is the frequency band between 9 GHz and 18 GHz, implying that the Josephson junction oscillating linewidth should be kept below 137 KHz. However, the VCO oscillation linewidth must be constrained to be less than 1 octave because harmonic distortion of a 9 GHz signal could introduce inband error at 18 GHz.

With the choice of a 9 GHz to 18 GHz frequency range, the reference voltage $V_r$ is preferably chosen such that when the quantized voltage sample $V_s$ is equal to zero, both of the VCO s 40a, 40b (FIG. 3) oscillate at a center frequency equal to 13.5 GHz. When the voltage sample $V_s$ has a magnitude equal to the allowable full-scale value, the positive VCO 40a oscillates at 9 GHz, while the negative VCO 40b oscillates at 18 GHz. Each of the VCOs must be calibrated so that their upper and lower frequency limits correspond to the upper and lower voltage sample value limits.

The VCO implementation must additionally satisfy the signal power requirements of the overall conversion system. Typically, the output of a single Josephson junction oscillator is no greater than 40 dBm, which is only about 70 dB above the typical level of spurious signal noise. Furthermore, the linewidth of a single Josephson junction operating at around 13 GHz may exceed 10 MHz. Thus, a single Josephson junction may not provide sufficient power, or narrow enough frequency linewidth, to meet the requirements of the overall conversion system.

Figure 3A:
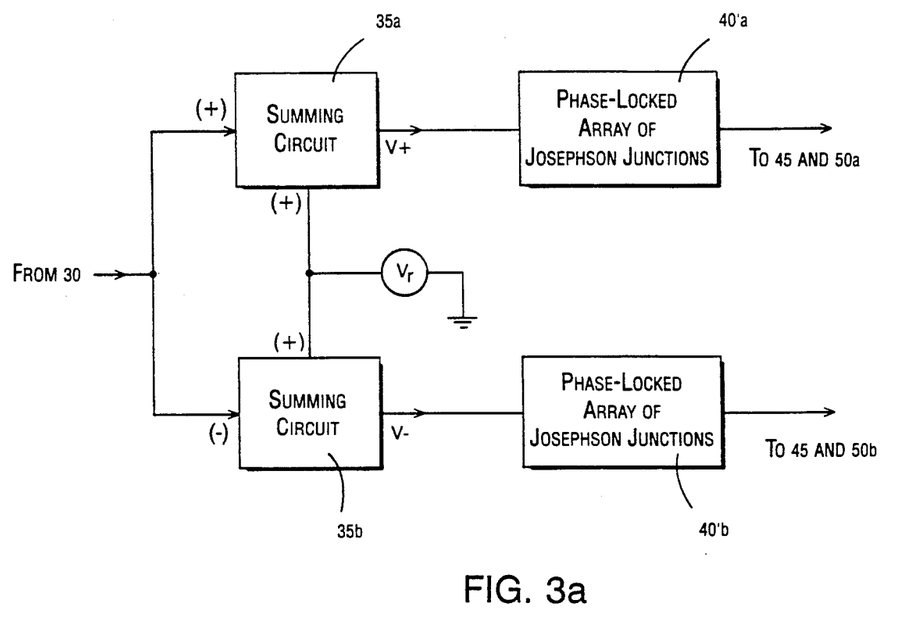
FIG. 3A is a block diagram of a second embodiment of the residue converter of FIG. 2 for a single residue base.

One possible implementation for overcoming these limitations is the use of an array of phase-locked Josephson junctions in place of a single junction implementation for VCOs 40a and 4b; as shown in FIG. 3AS, a Josephson junction array 40'a may replace the solitary junction 40a of FIG. 3, and a Josephson junction array 40'b may relace the solitary junction 40b of FIG. 3. With a suitable arrangement of inter array feedback which are inherently superconducting quantum interference devices (SQUIDs) themselves, an array of Josephson junctions may be interconnected so that all of the junctions oscillate at a single frequency. The output power of such an array including N junctions is equal to $N^2$ times the output power of a single junction. In addition, the frequency linewidth for the array is reduced from that of a single junction by a factor of $1/N$. The number of junctions N in the array may be as large as 200 or more, but is limited by the impact of array size on overall VCO performance. Other VCO implementations, including phase-locked loop control and amplification for a single Josephson junction, may also provide adequate voltage to frequency conversion performance.

One further possible VCO configuration may be implemented to increase the intrinsic dynamic range of the conversion system. As discussed below, the range of time delays of the time delay circuitry limits the dynamic range of the overall conversion system. The time delay $\tau$ is also limited, as discussed above, to be much shorter than the sample and hold quantization period. If, however, means are provided for storing a VCO frequency signal during the time delay, time delays longer than the quantization period may be implemented to increase the conversion dynamic range. This may be achieved by time-multiplexing a series of Josephson junctions, thereby providing the ability to convert a voltage sample value with one junction while holding the frequency signal of a previous value in another for succeeding time delay circuitry.

Referring again to FIG. 3, the two frequency signals, having the angular frequencies $\omega_+$ and $\omega_-$, from the outputs of the two Josphson junction VCOs 40a, 40b, respectively, are mixed and low-pass filtered with mixing circuitry 45 to produce a single frequency signal having an angular frequency, $\omega_o$, that is directly proportional to the voltage sample value $V_s$ as $$\omega_o = 4\pi k \times V_s.$$

This signal is used, as discussed below, as a reference signal against which time-delayed versions of the signal are compared.

The principal consideration for implementation choice of the mixing circuitry 45 is thermal noise that may be generated by the circuitry. A noise temperature greater than 100° K. may degrade the performance of the overall conversion system to unacceptable levels. A preferable mixer implementation exhibits a noise temperature no greater than about five times that of the circuitry s ambient temperature. This implementation may be realized with a device which is constructed as a sandwich of superconducting —insulating— superconducting materials (SIS) in a manner similiar to a Josephson junction. Such a SIS device provides efficient signal mixing because of its inherently highly nonlinear operational characteristic, which is based on single-electron tunneling across its insulating region. Given an ambient temperature of 4° K., an SIS mixer may be capable of generating a thermal noise temperature as low as 20° K., which is acceptable for overall conversion performance. Alternatively, an amplifier could be used at the output of the phase detector to reduce the effect of noise in the mixer.

In addition to acting as inputs to the mixing and filtering circuitry 45, the two frequency signals, $\omega_+$ and $\omega_-$ are each input to corresponding delay lines, 50a, and 50b, respectively, which time-delay the signals relative to the undelayed VCO output frequency signals. The duration of each of the two delay lines' delay is equal to $\tau_m/2$, with the value of $\tau_m$ being selected, as discussed below, to correspond to a particular residue base.

After propagating to the end of the delay lines, both of the frequency signals, $\omega_+$ and $\omega_-$, have acquired a phase shift, $\phi_+$ and $\phi_-$, respectively, which is determined by the duration of the delay, as $$\phi_+ = 2\pi k \times (V_r + V_s) \times \tau_m/2,$$

$$\phi_- = 2\pi k \times (V_r - V_s) \times \tau_m/2.$$

These two phase-shifted signals, $\phi_+$ and $\phi_-$, are mixed and low-pass filtered by mixing circuitry 55 to generate a single phase signal, $\phi_m$, having a phase shift that is linearly proportional to the voltage sample value $V_s$ as $$\phi_m = 2\pi k \tau_m V_s.$$

Figure 4:
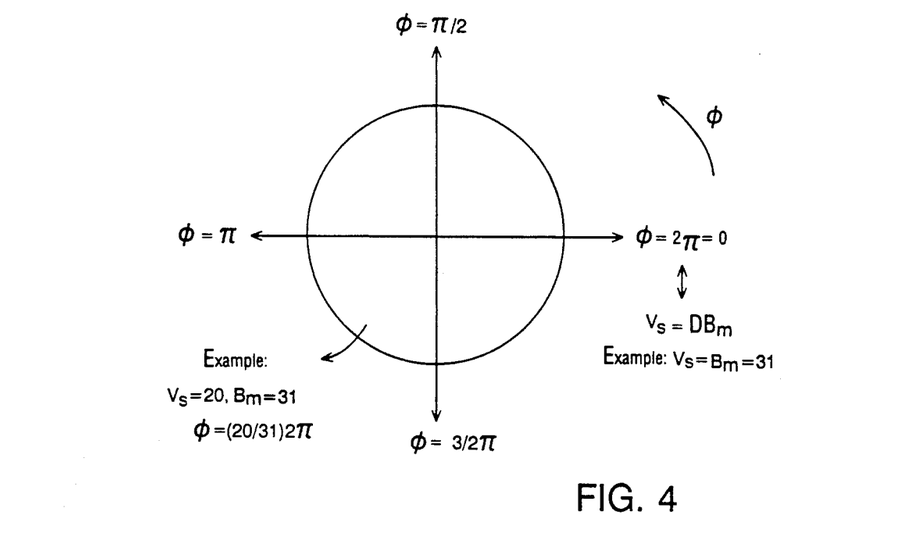
FIG. 4 is a diagram illustrating the correspondence between the period of angular phase and the period of an example residue base, 31, as determined for the converters of FIGS. 2 and 3.

Referring also to FIG. 4, this relationship between phase, time delay, and sample voltage is central to the operation of the conversion system because the inherently periodic phase variable provides a mechanism for mapping the periodicity of a residue system to the magnitude of a voltage sample, as follows. Any angle greater than or equal to $2\pi$ may be equated to an angle less than $2\pi$, since the radian period of angular phase is equal to $2\pi$. This correspondence is identical to that of a residue system, as previously discussed; any decimal multiple of a given residue has the same residue for that base, and all decimal integers that are equally larger (or smaller) than any multiple of a given residue base will have the same residue for that base. The period of the cycle for a given residue base is equal to the residue base value B, and the set of possible residues for the base is equal to 0,1,...,(B−1).

The period of a given residue system may be mapped to the $2\pi$ period of angular phase by selecting a suitable time delay $\tau$, in the above phase relationship, that equates the phase angle $\phi_m$ to a multiple of $2\pi$ (or equivalently 0) whenever the voltage sample value $V_s$ is a decimal multiple of a given residue base $B_m$ in FIG. 4). For example, with the residue base $B_m$ equal to 31, a value of $1/(31 \times k)$ for the time delay $\tau$ would cause any voltage sample value $V_s$ that is a decimal multiple of 31 to produce a phase angle of $2\pi$ (or equivalently 0). With this $\tau$ value for the residue base $B_m$ equal to 31, a voltage sample value $V_s$ equal to, for example, 20, would accordingly produce a phase angle of $2\pi k(1/31 \times k) \times 20$, or $20/31 \times 2\pi$, as shown in FIG. 4. In a similar manner, all other decimal integers whether less than or greater than the decimal value 31, would each produce a phase angle that is proportional to the residue base value 31.

By choosing a time delay $\tau$ which maps all decimal multiples of a residue base to the phase value $2\pi$, all other decimal integer values are mapped to some phase angle between 0 and $2\pi$, so that the entire cycle of residues for a residue base is mapped to the angular phase of a signal. Thus, the phase shift of a signal which has been delayed for a time $\tau$ "removes" multiples of a residue base $B_m$ from a voltage sample value with its inherent $2\pi$ periodicity in angular phase. The resulting value of the phase shift is then given as being directly proportional to the residue value of the voltage sample value for the residue base $B_m$.

The choice of residue bases and corresponding time delays is made, as discussed above, to achieve a desired dynamic range for the voltage amplitude of the analog signals to be converted. In addition, the binary equivalent of the largest residue base value must be compatible with the word size of the DSP computer. Expressed as an equality, this requires that $$(B_{max} - 1) = 2^N,$$

where $B_{max}$ is the largest residue base chosen and $N$ is the number of bits in a word. By satisfying this equality, it is ensured that any residue for any of the selected residue bases will not cause an overflow of the computer word storing that residue, because the largest possible residue for a residue base B is (B−1).

Together, word size and the values and number of residue bases selected effect conversion speed, vulnerability to error, and required hardware complexity. Table 2 below is a comparison of possible residue base values which are purely prime and the properties of a conversion system using different groupings of those residue bases. In the table, the dynamic range value is the product of the residue bases in a given row, and the complexity value is the product of the number of bits for a computer word and the number of residue bases in a given row. Considering the values in this table, a judicious choice of residue bases should maximize dynamic range while minimizing hardware complexity.

TABLE 2

PROPERTIES OF RESIDUE SYSTEMS INCLUDING VARIOUS RESIDUE BASES

| N (# BITS IN A COMPUTER WORD) | M (# RESIDUE BASES) | RESIDUE BASES | DYNAMIC RANGE | COMPLEXITY |
|---|---|---|---|---|
| 2 | 2 | 3,2 | 6 | 4 |
| 3 | 2 | 7,5 | 35 | 6 |
|   | 3 | 7,5,3 | 105 | 9 |
|   | 4 | 7,5,3,2 | 210 | 12 |
| 4 | 2 | 13,11 | 143 | 8 |
|   | 3 | 13,11,7 | 1,001 | 12 |
|   | 4 | 13,11,7,5 | 5,005 | 16 |
|   | 5 | 13,11,7,5,3 | $1.5 \times 10^4$ | 20 |
|   | 6 | 13,11,7,5,3,2 | $3 \times 10^4$ | 24 |
| 5 | 2 | 31,29 | 899 | 10 |
|   | 3 | 31,29,23 | $2.1 \times 10^4$ | 15 |
|   | 4 | 31,29,23,19 | $3.9 \times 10^5$ | 20 |
|   | 5 | 31,29,23,19,17 | $6.7 \times 10^6$ | 25 |
|   | 6 | 31,29,23,19,17,15 | $8.7 \times 10^7$ | 30 |
| 6 | 2 | 61,59 | 3,599 | 12 |
|   | 3 | 61,59,53 | $1.9 \times 10^5$ | 18 |
|   | 4 | 61,59,53,47 | $9.0 \times 10^6$ | 24 |
|   | 5 | 61,59,53,47,43 | $3.9 \times 10^8$ | 30 |
|   | 6 | 61,59,53,47,43,41 | $1.6 \times 10^{10}$ | 36 |
| 7 | 2 | 127,113 | $1.4 \times 10^4$ | 14 |
|   | 3 | 127,113,109 | $1.5 \times 10^6$ | 21 |
|   | 4 | 127,113,109,107 | $1.7 \times 10^8$ | 28 |
|   | 5 | 127,113,109,107,103 | $1.7 \times 10^{10}$ | 35 |
| 8 | 2 | 251,241 | $6.0 \times 10^5$ | 16 |
|   | 3 | 251,241,239 | $1.4 \times 10^7$ | 24 |
|   | 4 | 251,241,239,233 | $3.3 \times 10^9$ | 32 |
|   | 5 | 251,241,239,233,229 | $7.7 \times 10^{11}$ | 40 |

Considering Table 2, choosing a bit-word size of, e.g., 5 bits (N=5), the largest residue base that can be represented with this word size is 31, since $2^5 = 32$. The next two largest purely prime bases are 29 and 23, giving a three-residue base conversion system with a dynamic range of $$31 \times 29 \times 23 = 20,667,$$

with the decimal integer 20,666 being the largest number of steps the full scale input analog voltage can be divided into and be unambiguously represented by this three residue base system. A comparison similar to that of Table 2 may be correspondingly generated for residue systems using mutually prime, rather than purely prime, residue bases to determine the trade-offs between dynamic range and hardware complexity in implementing a residue system using mutually prime bases.

Considering the residue base choices for a 16-bit conversion scheme, a three-residue system of, e.g., 31, 29, and 23 requires three parallel channels like the one of FIG. 3, with each channel including delay lines which correspond to one of the three residue bases. In particular, a delay $\tau_m$ must be selected for the delay lines of each of the three channels, with this delay value satisfying the phase voltage equation discussed above. Given the three delay values, each of them are accordingly implemented with delay line lengths in the corresponding channels. The final choice of delay line length must consider all constraints for optimizing resolution of delay time and for minimizing the delay line length required to achieve the desired dynamic range of input analog voltage sample values.

Additional parallel channels may be included with the chosen residue channels to provide error detection for the residue channels. With the inclusion of error detection channels, when one or more of the residue channels generates an erroneous residue value, the error detection channels signal the error, and in some cases allow for correction of the error. This error detection function is particularly important for the residue conversion because even a small error in one of the conversion channels results in a global error effecting all of the channels if the channels are analyzed collectively to determine the decimal integer that they represent.

To implement residue error detection, one channel, identical to those of the residue channels, is added for each error channel. If two error channels are used, single channel errors may be detected and corrected, while if four error channels are used, double channel errors may be detected and corrected. The number of error detection channels included is therefore determined as a function of the desired error correction capability. The residue base values chosen for each of the error detection channels must be larger than any of the residue bases in the residue conversion channels to provide error correction ability, as discussed below.

Considering a four residue channel system with the residue bases 23, 25, 26, and 27, two additional channels, with the residue bases 29 and 31, provide error detection for the four residue channels. If, for example, an analog signal with the decimal value 20703 is incorrectly given a residue representation of [4, 3, 7, 21, 26, 28] instead of its correct representation of [3, 3, 7, 21, 26, 28], the error in the first channel may be detected and corrected. This is achieved using additional processing circuitry to evaluate the decimal value represented by each of the possible four element subsets of the six residues, with the number of subset elements corresponding to the number of residue conversion channels.

There are 15 different four element subsets for the six channels residue representation of [3, 3, 7, 21, 26, 28]. If the decimal value represented by a particular subset is larger than the dynamic range given by the residue bases, it is disregarded, while all other values are considered. The decimal value most frequently represented by the various subsets is the correct decimal value to be converted. For example, all four element subsets of the six residues [3, 3, 7, 21, 26, 28] represent the following decimal numbers: 38253, 322303, 262503, 255603,, 209028, 155553, 183567, 151275, 114199, 93522, 20703, 20703, 20703, 20703. Because the decimal value 20703 appears most frequently in this list, it is deduced as the correct decimal value. Once the correct decimal value is deduced, further processing circuitry may correct the erroneous residue value and any operational results using it.

Referring again to the conversion system in FIG. 3, the delay line devices 50a and 50b may be implemented as coaxial lines, optical delay cubes, dielectric lines, plane-parallel strip transmission lines, or other suitable configuration. Given a VCO implementation with superconducting Josephson junctions, the delay lines 50a and 50b are preferably Implemented using superconducting materials. Superconducting delay lines are particularly attractive because they exhibit significantly less line loss and dispersion than other delay line configurations.

Given any choice of delay line configuration, the length of the lines must be controlled to, e.g., 1 part in $2^{16}$ to achieve an overall conversion precision of 1 part in $2^{16}$. Dispersion, or the effect of signal frequency on delay line propagation, must also be highly controlled because of the central importance of precision delay and phase generation to the residue conversion process.

As shown in FIG. 3, the phase signal $\phi_m$ that is generated by the delay mixing and filtering circuitry 55 is input, along with the undelayed signal $\omega_o$, to a phase detector 60, consisting of mixing and low-pass filtering circuitry. This phase detector measures the difference in phase between its two input signals $\omega_0$ and $\phi_m$, to generate a phase-difference signal, $\Delta\phi$, having a magnitude equal to that phase difference, which is proportional to the residue of the voltage sample $V_s$ for the residue base specified by the particularly chosen delay line length and corresponding delay.

The phase detection circuitry 60 may be implemented as a basic "analog" phase detector for generating an analog phase-difference signal, $\Delta\phi$, or may include a combination of analog and digital quantization/coding hardware 70 for directly generating a digital representation of the residue value of the voltage sample value $V_s$. Alternatively, quantization circuitry 70 may be distinct from the phase detector 60. Thus, the residue conversion system may be adapted to generate an analog residue value for digital conversion by a conventional analog to digital converter, or using quantization/coding hardware 70, may directly generate a digital residue value. If quantization/coding hardware 70 is used to generate a digital residue value, the hardware processes the phase difference value $\Delta\phi$, using the relationship between phase, time delay, and voltage discussed above, to recover the value of the voltage sample from the measured phase difference value.

The overall residue conversion system may be implemented as discrete components, or preferably as a monolithically integrated system. A monolithic configuration provides improved impedance matching and noise immunity.

Other embodiments of the residue conversion system are within the scope of the claims. For example, rather than including a distinct sample and hold circuit 30, summing circuitry 35a and 35b, and Josephson junctions 40a and 40b in each channel of the residue conversion system, a single sample and hold circuit, summing circuitry, and Josephson junctions may be configured to simultaneously and in parallel accommodate individual residue channels which each only include delay line, phase detection, and quantization circuitry. This implementation reduces hardware redundancy throughout the residue conversion system while maintaining system performance. In this implementation, an array of phase locked Josephson junctions may be used to generate each of the required frequency signals, with a number of junctions in each array being designated for each residue channel. This ensures that each channel receives a frequency signal having characteristics that are identical to those of the frequency signals received by the other channels.

In another embodiment, the length and corresponding delay $\tau$ of each delay line in the conversion system may be chosen to convert the value of an analog voltage sample to a digital representation having a format other than the residue number format. In fact, the conversion system's functionality is so generalized that delay line specification is the only requirement for adapting the system to convert an analog signal's value to a digital representation in a particularly chosen number system. For example, by specifying each of the delay lines to correspond to the bit position value of one bit in a multibit binary representation, the conversion system may convert an analog voltage sample value to a digital binary representation. That is, the delay line produces at least one time-delayed signal with a phase shift that indicates the value of one component representation or bit for the analog signal amplitude in the number system, the number system including a range of component or multibit representations corresponding o the ranges.

In this binary implementation, the delay $\tau$ of a given delay line is chosen to be proportional to the power of two for the bit position value of that delay line's specified bit position. Accordingly, a delay line for the fourth bit position, which has a bit position value of $2^3 = 8$, would then use a delay proportional to the value 8 to extract the binary value of a decimal voltage sample for the fourth bit position. The binary values generated by the delay lines may be inherently digitized by the phase detection circuitry, or may be digitized by distinct quantization/coding circuitry. In either case, except for the delay line specifications, all of the components of the residue conversion system may be identically implemented in the binary conversion system.

What is claimed is:

1. Apparatus of converting an analog signal into digital format for a preselected number system, comprising:
   a variable frequency oscillator connected to receive a time-sample of said analog signal, said oscillator generating a frequency signal having a frequency that is a function of the amplitude of said analog signal,
   a delay line connected to receive said frequency signal, said delay line producing at least one time-delayed signal with a phase shift, relative to said frequency signal, that indicates the value of one component representation for the analog signal amplitude in said number system, the number system being comprised of a range of component representations for equivalently representing the range of amplitudes of said analog signal, and
   a phase detector connected to receive said time-delayed signal, said phase detector generating a digital format for said number system representation, said digital format based on a number system distinct from said preselected number system, whereby said analog signal amplitude is converted directly to a digitized version of the corresponding number in the preselected number system.

2. The apparatus of claim 1 wherein said preselected number system comprises at least one residue base and said digital format is a digital residue number format corresponding to said residue base.

3. The apparatus of claim 2 wherein said preselected number system comprises a plurality of residue bases and said delay line produces a plurality of item-delayed signals each with a phase shift, relative to said frequency signal, that corresponds to the amplitude of said time sample represented as a residue for one of said residue bases.

4. The apparatus of claim 3 further comprising a plurality of phase detectors each connected to receive one of said time-delayed signals, each of said phase detectors generating a digital format for the amplitude of said time sample represented as a residue for one of said residue bases.

5. The apparatus of claim 4 further comprising sample and hold circuitry connected to receive said analog signal, said sample and hold circuitry generating said time-sample of said analog signal.

6. Apparatus for converting an analog signal into digital residue number format, said digital residue format comprising a plurality of digital residues each corresponding to one of a plurality of preselected residue bases, comprising:
   a plurality of residue channels each generating a digital residue corresponding to one of said preselected residue bases, each of said residue channels comprising:
      a plurality of variable frequency oscillators each connected to receive a item-sample of said analog signal, each of said oscillators generating a frequency signal having a frequency that is a function of the amplitude of said time-sample,
      a plurality of delay lines each connected to receive one of said frequency signals, each of said delay lines producing at least one time-delayed signal with a phase shift, relative to said frequency signal, that corresponds to the amplitude of said time-sample represented as a residue for said one preselected residue base, and
      a phase detector connected to receive said time-delayed signals, said phase detector generating a digital residue format corresponding to said one preselected residue base.

7. The apparatus of claim 6 further comprising at least one residue channel for detecting errors in the digital residues generated by said residue channels.

8. The apparatus of claim 6 wherein each of said residue channels further comprises sample and hold circuitry connected to receive said analog signal, said sample and hold circuitry generating said time-sample of said analog signal.

9. The apparatus of claim 6 wherein each of said oscillators comprises a voltage-controlled oscillator.

10. The apparatus of claim 1 (wherein said frequency signal has a frequency that is linearly proportional to the amplitude of said time-sample.

11. The apparatus of claim 10 wherein each of said oscillators comprises a Josephson junction oscillator.

12. The apparatus of claim 6 wherein said oscillators comprise an array of phase-locked oscillators, with each of said phase-locked oscillators generating said frequency signal.

13. The apparatus of claim 6 wherein said oscillators comprise an array of time multiplexed oscillators, each of said time multiplexed oscillators generating said frequency signal.

14. The apparatus of claim 6 wherein each of said residue channels further comprises phase-locked loop circuitry for controlling each of said oscillators.

15. Apparatus for converting an along signal into digital residue number format, said digital residue format comprising a plurality of digital residues each corresponding to one of a plurality of respected residue bases, comprising:
   sample and hold circuitry connected to receive said analog signal, said sample and hold circuitry generating a time-sample of said analog signal,
   summation circuitry connected to receive said time-sample, said summation circuitry processing said time-sample with a reference voltage to produce a plurality of summation signals each corresponding to either a sum of the amplitudes of said time-sample and said reference voltage or a difference in the amplitudes of said time-sample and said reference voltage,
   a plurality of phase-locked, variable frequency oscillators each connected to receive one of said summation signals, each of said oscillators generating a frequency signal having a frequency that is a function of the amplitude of said time-sample,
   first mixing and filtering circuitry connected to receive each of said frequency signals, said first mixing and filtering circuitry generating a single reference frequency signal that is a function o the amplitude of said time-sample, and
   a plurality of residue channels each generating a digital residue corresponding to one of said preselected residue bases, each of said residue channels comprising:
      a plurality of delay lines each connected to receive on of said frequency signals, each of said delay lines producing at least one time-delayed signal with a phase shift, relative to said reference frequency signal, that corresponds to the amplitude of said time-sample represented as a residue for said one preselected residue base, second mixing and filtering circuitry connected to receive each of said time-delayed signals, said second mixing and filtering circuitry generating a single time-delayed signal with a phase shift, relative to said reference frequency signal, that corresponds to the amplitude of said time-sample represented as a residue for said one preselected residue base, a phase detector connected to receive said time-delayed signal and said preference frequency signal, said phase detector generating a phase signal having a magnitude and frequency that is a function of said phase shift, and quantization circuitry connected to receive said phase signal, said phase signal, said quantization circuitry generating digital residue format corresponding to said one preselected residue base.

16. The apparatus of claim 15 further comprising at least one residue channel for detecting errors in the digital residues generated by said residue channels.

17. The apparatus of claim 15 wherein said first and second mixing and filtering circuitry includes low pass filtering circuitry.

18. The apparatus of claim 15 wherein each of said oscillators comprises a Josephson junction oscillator.

19. The apparatus of claim 18 wherein each of said oscillators comprises a niobium/magnesium oxide Josephson junction.

20. The apparatus of claim 18 wherein each of said delay lines comprises a superconducting delay line.

21. The apparatus of claim 15 wherein said delay lines simultaneously produce said time-delayed signals.

22. A method for converting an analog signal directly into digital format for a preselected number system, comprising the steps of:
generating at least one frequency signal having a frequency that is a function o the amplitude of said analog signal,
delaying said frequency signal by at least one time delay to produce at least one time-delayed signal with a phase shift, relative to said frequency signal, that indicates the value of one component representation for the analog signal amplitude in said number system, the number system being comprised of a range of component representations for equivalently representing the range of amplitudes of said analog signal, and
converting said time-delayed frequency signal into a digital format for said number system representation, said digital format based on a number system distinct from said preselected number system, whereby said analog signal amplitude is converted directly to a digitized version of the corresponding number in the preselected number system.

23. The method of claim 22 wherein said preselected number system comprises at least one residue base and said digital format is a digital residue number format corresponding to said residue base.

24. The apparatus of claim 1 wherein said phase detector generates a multibit digital format for each said component representation.

25. The apparatus of claim 1 wherein said preselected number system is a number system other than the base two number system.

* * * * *

UNITED STATES PATENT AND TRADEMARK OFFICE
CERTIFICATE OF CORRECTION

PATENT NO. : 5,189,420
DATED : Feb. 23, 1993
INVENTOR(S) : F. Neal Eddy, et al

It is certified that error appears in the above-indentified patent and that said Letters Patent is hereby corrected as shown below:

In Column 6, line 21, delete "$1/R_x>\tau.$" and insert --$1/R_s>\tau.$--
In Column 8, line 19, delete "VCOs +" and insert --VCO's--
In Column 8, line 55, delete "VCO s" and insert --VCO's--
In Column 8, line 66, delete "40 dBm," and insert -- -40 dBm,--
In Column 9, line 9, delete "4b" and insert --40b--; and delete "FIG. 3AS," and insert --FIG. 3A,--
In Column 9, line 63, delete "circuitry s" and insert --circuitry's--
In Column 10, line 56, insert --($DB_m$-- after "$B_m$"
In Column 11, line 1, delete "$\pi$" and insert --$\tau$--
In Column 11, line 58, insert --15-- in the Complexity column.
In Column 13, line 39, delete "Implemented" and insert --implemented--
In Column 14, line 56, delete "o" and insert --to--
In Column 16, line 17, delete "(" after "claim 1".
In Column 16, line 33, delete "along" and insert --analog--

Signed and Sealed this

Twelfth Day of April, 1994

Attest:

Attesting Officer

BRUCE LEHMAN

Commissioner of Patents and Trademarks